United States Patent
Yeo et al.

(10) Patent No.: US 6,562,727 B2
(45) Date of Patent: May 13, 2003

(54) METHODS AND COMPOSITIONS FOR REMOVAL OF ANTI-REFLECTIVE LAYERS USING FLUORINE CONTAINING COMPOUNDS, OXIDANTS, AND WATER

(75) Inventors: In-jun Yeo, Seoul (KR); Byoung-moon Yoon, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/750,955

(22) Filed: Dec. 28, 2000

(65) Prior Publication Data

US 2002/0042207 A1 Apr. 11, 2002

(30) Foreign Application Priority Data

Jul. 19, 2000 (KR) .......................... 2000-41427

(51) Int. Cl.[7] .............................. H01L 21/302
(52) U.S. Cl. .................. 438/745; 438/753; 438/754; 438/757; 252/79.1; 252/79.2; 252/79.3
(58) Field of Search ................ 438/745, 753, 438/754, 757; 252/79.1, 79.2, 79.3

(56) References Cited

U.S. PATENT DOCUMENTS

| | | | | |
|---|---|---|---|---|
| 5,294,294 A | * | 3/1994 | Namose | 156/643 |
| 5,858,861 A | * | 1/1999 | Weng et al. | 438/439 |
| 6,017,827 A | * | 6/2000 | Lim et al. | 438/725 |
| 6,071,827 A | * | 6/2000 | Lim et al. | 438/725 |
| 6,187,644 B1 | * | 2/2001 | Lin et al. | 438/303 |
| 6,200,909 B1 | * | 3/2001 | Torek et al. | 438/745 |

FOREIGN PATENT DOCUMENTS

| KR | P1999-011070 | * | 2/1999 | ....... H01L/21/027 |
|---|---|---|---|---|
| KR | P1999-011634 | * | 2/1999 | ....... H01L/21/027 |

* cited by examiner

Primary Examiner—Robert Kunemund
Assistant Examiner—Charlotte A. Brown
(74) Attorney, Agent, or Firm—Myers Bigel Sibley & Sajovec, P.A.

(57) ABSTRACT

Methods for the removal of anti-reflective layers during fabrication of integrated circuits are disclosed. In particular, an anti-reflective pattern or layer can be removed using a solution that includes a fluorine containing compound, an oxidant, and water. The fluorine containing compound in the solution can be hydrogen fluorine containing compound. Preferably, the oxidant in the solution is $H_2O_2$. The oxidant in the solution can also be ozone water. Related compositions are also disclosed.

26 Claims, 3 Drawing Sheets

METHODS AND COMPOSITIONS FOR REMOVAL OF ANTI-REFLECTIVE LAYERS USING FLUORINE CONTAINING COMPOUNDS, OXIDANTS, AND WATER

CLAIM FOR PRIORITY AND CROSS-REFERENCE TO OTHER APPLICATIONS

This application claims priority to Korean Application No. 00-41427, filed Jul. 19, 2000, the disclosure of which is hereby incorporated herein by reference.

FIELD OF THE INVENTION

The present invention relates to the field of integrated circuit fabrication in general and, more particularly, to the removal of anti-reflective layers during integrated circuit fabrication.

BACKGROUND OF THE INVENTION

As the density of integrated circuits increase, so may the need for forming fine patterns therein. For example, integrated circuit memory devices with a capacity of 1-Gigabit or more may need a pattern size having a design rule of about 0.2 μm or less. However, it may be difficult to use conventional i-line photoresists to form such fine patterns. Thus, a photolithography technique using Deep Ultraviolet (DUV) photoresist has been suggested.

It is known to deposit a photoresist layer on multiple material layers of an integrated circuit device and expose a portion of the photoresist layer to light develop the photoresist layer into photoresist patterns. An anti-reflective layer may be formed under the photoresist layer to prevent diffusion reflection from the underlying layers during exposure and thereby achieve higher resolution photolithography.

In particular, it is known to use a silicon oxynitride layer as the anti-reflective layer with a DUV photoresist. The silicon oxynitride layer can suppress diffusion reflection from the underlying layers. Furthermore, the silicon oxynitride layer may reduce undesirable effects that may occur during patterning of the photoresist layer. For example, the silicon oxynitride layer may help avoid a phenomenon referred to as photoresist poisoning, which can lead to a footing phenomenon after development of the photoresist layer.

FIGS. 1A through 1D are cross-sectional views that illustrate a conventional method for fabricating integrated circuits. In particular, FIGS. 1A through 1D illustrate a photolithography process in which a silicon oxynitride layer can be used as an anti-reflective film in forming a gate electrode of a transistor.

First, according to FIG. 1A, a doped polysilicon layer and an anti-reflective layer, such as a silicon oxynitride layer, are sequentially deposited on an integrated circuit substrate 10 having an isolation region 12 and an oxide layer. After forming a photoresist pattern 28 on the resultant structure, the anti-reflective layer, the doped polysilicon layer and the oxide layer are sequentially etched using the photoresist pattern 28 as an etching mask, thereby resulting in an anti-reflective pattern 26, a gate electrode 24 and a gate oxide layer 22 as shown in FIG. 1A.

Next, the photoresist pattern 28 is removed to expose the anti-reflective pattern 26 on the gate electrode 14, as shown in FIG. 1B. The exposed anti-reflective pattern 26 can have a thickness of about 300 to 400 Angstroms. According to some conventional techniques, the anti-reflective pattern 26 can be removed during a cleaning process that uses a mixture of $NH_4OH$, $H_2O_2$ and deionized water in a ratio of 1:4:20 by volume (hereinafter, referred to as "SC-1") as the cleaning solution. In other conventional processes an HF solution can be used as the cleaning solution. The cleaning process can be followed by a rinsing process using deionized water.

Unfortunately, when SC-1 is used to etch the anti-reflective pattern 26, the underlying polysilicon layer of the gate electrode 24 may also be etched. On the other hand, if an HF solution is used to remove the anti-reflective pattern 26, the anti-reflective pattern 26 may not be fully removed, such that a remnant anti-reflective pattern 26a may remain on the gate electrode 24. Moreover, the remnant anti-reflective pattern 26a may include semi-spherical defects (or seeds).

The defects can be caused by the porous nature of the silicon oxynitride layer. In particular, when an unstable porous structure, such as the silicon oxynitride layer, is present on a hydrophobic layer, such as the polysilicon layer, a portion of the unstable porous structure (i.e., the silicon oxynitride layer) may remain on the surface of hydrophobic layer (i.e., the polysilicon layer) after cleaning. Seeds may have an increased tendency to form on a hydrophobic layer compared to a hydrophilic layer, due to the presence of dangling bonds on its surface.

The remaining portion of the silicon oxynitride layer may react with silica ($Si_xO_y$) in the deionized water that is used in the rinsing process to cause the semi-spherical defects. The remnant anti-reflective pattern 26a may act as a barrier in subsequent ion implantation or metal silicide formation, thereby increasing the probability of a device failure.

The remnant anti-reflective pattern 26a, including the semi-spherical defects which remains on the gate electrode 24, may be removed by increasing the amount of etching during the a chemical cleaning process. However, as shown in FIG. 1D, the isolation region 12 may be unacceptably recessed or an undercut 22a may be formed in the gate oxide layer 22 by increased etching. Thus, it can be difficult to provide processing margins sufficient to remove the anti-reflective pattern 26 while reducing over etching of other portions of the integrated circuit.

SUMMARY OF THE INVENTION

Embodiments according to the present invention can provide methods and compositions for the removal of anti-reflective layers during fabrication of integrated circuits. Pursuant to these embodiments, an anti-reflective pattern or layer can be removed from an integrated circuit using a solution that includes a fluorine containing compound, an oxidant, and water. In some embodiments, the fluorine containing compound in the solution is Hydrogen Fluoride (HF). Preferably, the oxidant in the solution is $H_2O_2$. In some embodiments, the oxidant in the solution is ozone water. The water can be deionized water.

In some embodiments according to the present invention, the solution can be about 50% or more oxidant by volume. In some embodiments according to the present invention, a ratio of the fluorine containing compound to the oxidant in the solution can be in a range between about 14:800 and 14:1000 by volume. In some embodiments according to the present invention, the fluorine containing compound can be an HF solution that is 49% pure.

In other embodiments according to the present invention, the oxidant can be 30% pure $H_2O_2$ that is in a range between about 50% and 80% of the solution by volume. In other embodiments according to the present invention, a ratio of the fluorine containing compound to the oxidant to the deionized water in the solution can be in a range between about 14:1100:300 to 14:1000:400 by volume.

In other embodiments according to the present invention, an integrated circuit can be fabricated by forming a conductive layer on an integrated circuit substrate. An anti-reflective layer can be formed on the conductive layer. A photoresist pattern can be formed on the anti-reflective layer. The anti-reflective layer and the conductive layer can be etched using the photoresist pattern as an etching mask to provide an anti-reflective pattern and a gate electrode. The anti-reflective pattern can be removed using a solution containing a fluorine containing compound and an oxidant.

In some embodiments according to the present invention, an anti-reflective layer removal composition can include a solution of a fluorine containing compound, an oxidant, and water. The solution can about 50% or more oxidant by volume. In some embodiments according to the present invention, a ratio of the fluorine containing compound to the oxidant in the solution can be in a range between about 14:800 and 14:1000 by volume. In other embodiments, the solution can be less than about 80% oxidant by volume. In some embodiments according to the present invention, the water can be deionized water.

In some embodiments according to the present invention, the conductive layer can be polysilicon. In some embodiments according to the present invention, the anti-reflective layer can be a silicon oxynitride layer. In some embodiments according to the present invention, the anti-reflective layer can be formed by one of a chemical vapor deposition and a physical vapor deposition.

DETAILED DESCRIPTION OF EMBODIMENTS OF THE INVENTION

Figure 1A:
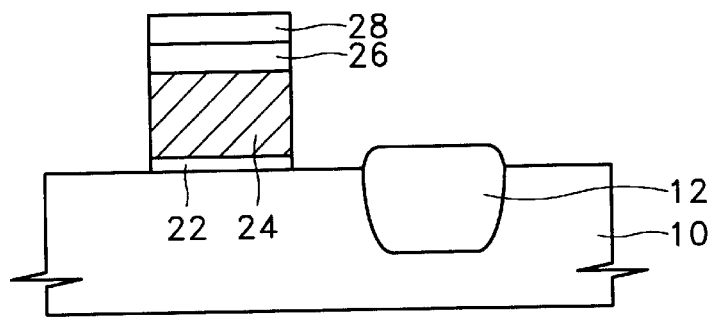
FIGS. 1A through 1D are cross-sectional views that illustrate a conventional method for fabricating an integrated circuit.
Figure 1B:
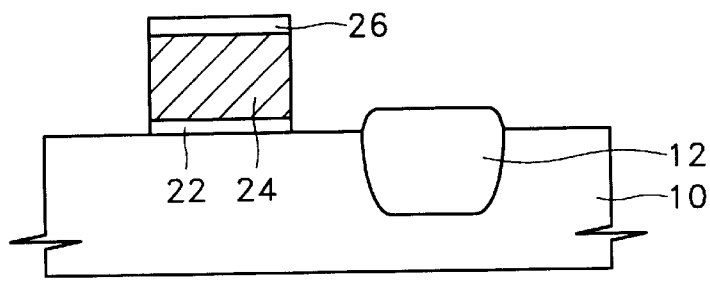
Figure 1C:
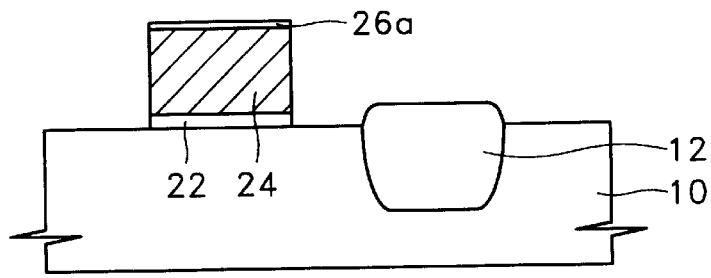
Figure 1D:
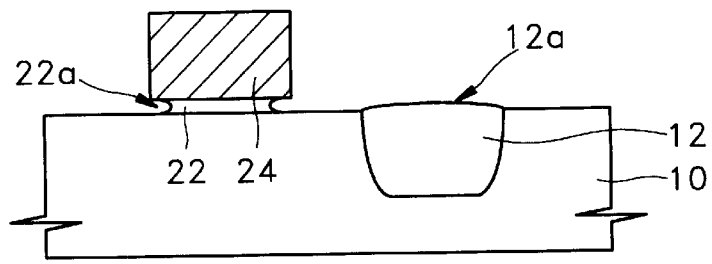

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present. As used herein, the term "solution" includes, but is not limited to, true solutions, colloidal solutions, homogeneous solutions, heterogeneous solutions, and other types of mixtures known to those having skill in the art.

Embodiments according to the present invention can provide methods and compositions for the removal of anti-reflective layers during fabrication of integrated circuits. Pursuant to these embodiments, an anti-reflective pattern or layer can be removed using a solution that includes a fluorine containing compound, an oxidant, and water.

The fluorine containing compound can be any compound that includes a fluoride. For example, the fluorine containing compound can be Hydrogen Fluoride (HF). Other compounds can be used. The fluorine containing compound can also be a solution containing HF and $NH_4F$ which made be commercially available under the trade name LAL. The oxidant can be an oxidizing material that can spontaneously evolve oxygen either room temperature or under heating. The term "oxidant" can be a chemical such as a peroxide, a chlorate, a perchlorate, a nitrate, a permanganate, and the like. Preferably, the oxidant in the solution is $H_2O_2$. The oxidant can also be $O_3$ which may show characteristics that are similar to other oxidants disclosed herein.

Figure 2:
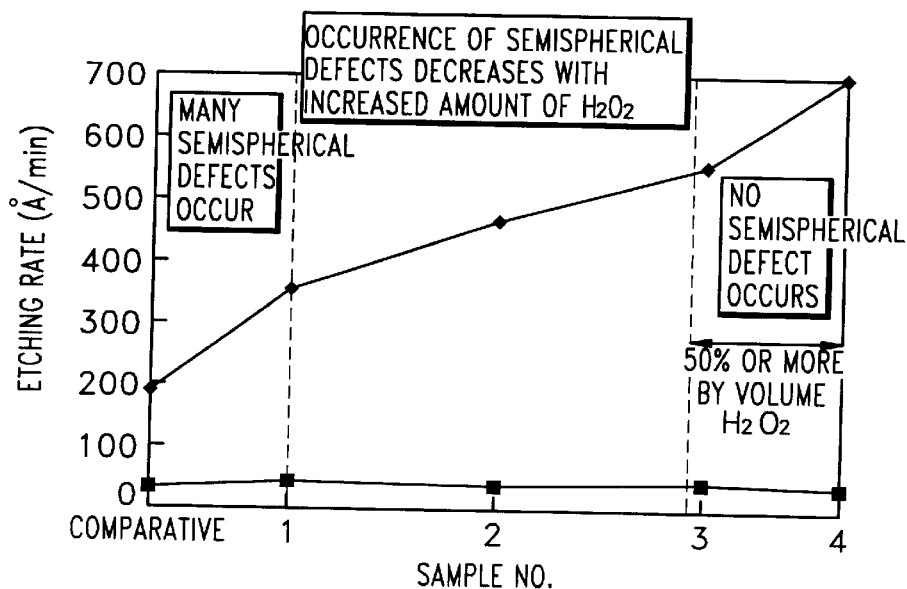
FIG. 2 is a graph that illustrates removal rates of an anti-reflective layer, the etching rate of a peripheral oxide layer, and the occurrence of semi-spherical defects with respect to amounts of $H_2O_2$ in a solution used to remove an anti-reflective layer according to the present invention.

FIG. 2 is a graph showing the removal rate of an anti-reflective layer (-♦-), the etching rate of a peripheral oxide layer (-■-), and the occurrence of semi-spherical defects, as a function of the percentage of $H_2O_2$ in a solution used to remove the anti-reflective layer in the fabrication of integrated circuits according to the present invention.

Figure 4A:
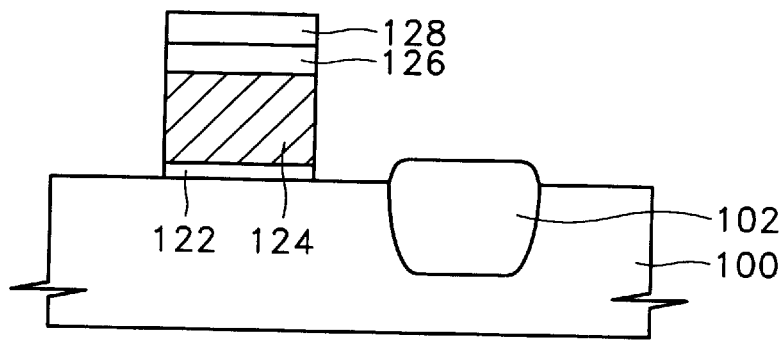
FIGS. 4A through 4C are cross-sectional views that illustrate methods for fabricating integrated circuits according to the present invention.
Figure 4B:
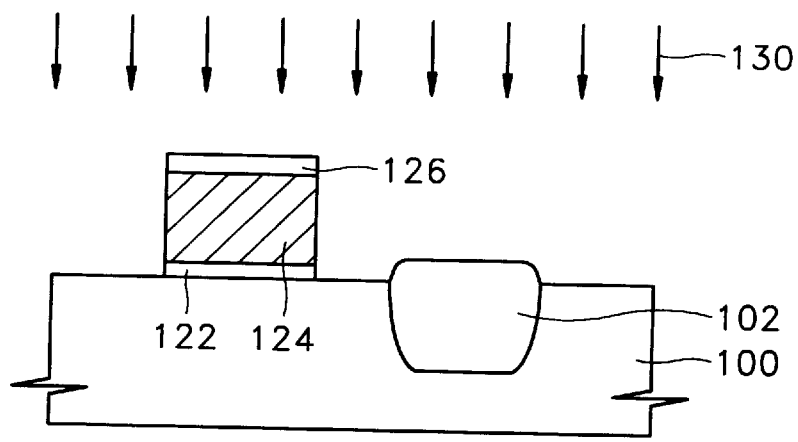

A plurality of samples, each having an anti-reflective layer about 700 Å thick on a polysilicon pattern as shown in FIG. 4B, were tested. The anti-reflective layer can be a silicon oxynitride layer formed using Chemical Vapor Deposition (CVD) or Physical Vapor Deposition (PVD). Other materials and processes can be used.

The data corresponding to the tested samples are referred to by sample numbers "1", "2", "3" and "4" along the horizontal axis of the graph in FIG. 2. Each of the samples was treated in a solution containing HF, $H_2O_2$ and deionized water. The solution can be formed from 49% purity of HF stock solution, 30% purity of $H_2O_2$ solution and deionized water. Other components can be used.

The ratio of the HF, $H_2O_2$ and deionized water in the solution was varied for each of the samples to provide solutions having (HF:$H_2O_2$:deionized water) ratios of 14:200:1200, 14:500:900, 14:800:600, and 14:1000:400 for samples 1–4 respectively. For comparison, a conventional solution containing 49% purity of HF solution and deionized water in a ratio of 14:1400 by volume, but without $H_2O_2$, was applied to a sample designated as "Comparative" in FIG. 2. Exemplary results using the solutions on the prepared samples are illustrated in FIG. 2.

According to FIG. 2, as the ratio of $H_2O_2$ in the solution increases, the etching selectivity of the anti-reflective layer with respect to the oxide layer can increase up to, for example, 17 times the Comparative sample. In addition, when the ratio of $H_2O_2$ exceeds about 50% by volume of the solution, no semi-spherical defects were detected on the polysilicon layer after the removal of the anti-reflective layer.

Accordingly, when the ratio of $H_2O_2$ solution exceeds about 50% by volume of the solution, and the $H_2O_2$ solution is mixed with the HF solution at least in a ratio of 14:800 by volume, the semi-spherical defects remaining on the polysilicon layer after the removal of the anti-reflective layer can be effectively reduced. Furthermore, the etching of the material layers around the anti-reflective layer can be reduced. Moreover, it was evidenced that when the amount of $H_2O_2$ solution does not exceed about 80% by volume of the solution, growth of an oxide layer on the polysilicon layer can also be reduced.

Figure 3:
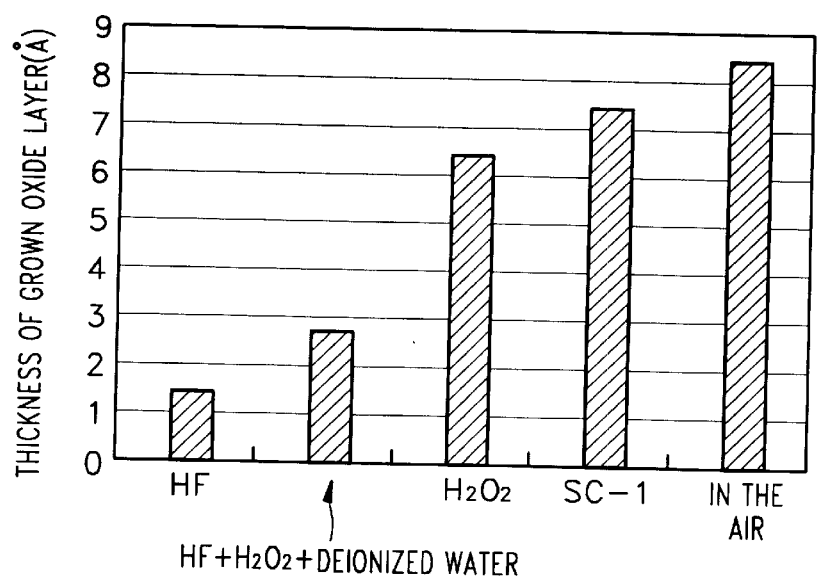
FIG. 3 is a graph that illustrates variations in thickness of oxide layers grown on a polysilicon layer after removal of the anti-reflective layer according to the present invention compared with conventional processes.

FIG. 3 is a graph that illustrates variations in a thickness of an oxide layer grown on a polysilicon layer after removal of an anti-reflective layer according to the present invention. For comparison, thicknesses of oxide layers grown on a polysilicon layer using conventional processes are also shown in FIG. 3.

As shown in FIG. 3, when the anti-reflective layer was removed using a solution according to the present invention, the oxide layer on the surface of the polysilicon layer grew a small amount compared to conventional processes, such as when the polysilicon layer was left in air or when only an $H_2O_2$ solution or SC-1 was used to remove the anti-reflective layer. In particular, compositions according to the present invention can contain an HF solution, an $H_2O_2$ solution and deionized water in a ratio of 14:1100:300 by volume. A solution containing only an HF solution also provided relatively little oxide layer growth, however, as shown in FIG. 2, an HF solution may cause excess semi-spherical defects on the polysilicon layer. Thus, an HF only solution may not be suitable.

Accordingly, the formation of semi-spherical defects and oxide layers on polysilicon layers after removal of an anti-reflective layer can be reduced by the use of a mixed cleaning solution formed from about 30% purity of $H_2O_2$ solution in a range of about 50 to 80% by volume of the mixed cleaning solution.

Figure 4C:
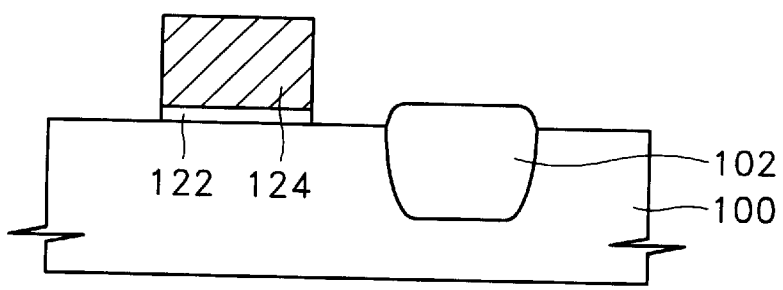

FIGS. 4A through 4C are cross-sectional views that illustrate methods for fabricating integrated circuits according to the present invention. As shown in FIG. 4A, a doped polysilicon layer and an anti-reflective layer, such as a silicon oxynitride layer, can be formed in sequence on an integrated circuit substrate 100 having an isolation region 102 and an oxide layer. The anti-reflective layer can be formed by Chemical Vapor Deposition (CVD) or Physical Vapor Deposition (PVD). Other processes may be used to form the anti-reflective layer.

A photoresist pattern 128 can be formed on the anti-reflective layer. Using the photoresist pattern 128 as an etching mask, the anti-reflective layer, the doped polysilicon layer and the oxide layer can be etched to form an anti-reflective pattern 126 on a gate electrode 124 and a gate oxide layer 122.

As shown in FIG. 4B, the photoresist pattern 128 can be removed using techniques known to those having skill in the art to expose the anti-reflective pattern 126. The anti-reflective pattern 126 can be removed using a solution 130 containing a fluorine containing compound and an oxidant. Preferably, a solution according to the present invention includes an HF solution as the fluorine containing compound. The oxidant can be $H_2O_2$, ozone water or other materials known to those having skill in the art. Preferably, the solution can further include deionized water.

The addition of an oxidant, such as $H_2O_2$ or ozone water to the HF solution, can make the exposed surface of the integrated circuit substrate 100 hydrophilic, which can reduce the formation of seeds of semi-spherical defects on the surface of the integrated circuit substrate 100. In other words, the surface of the integrated circuit substrate 100 may be oxidized more rapidly by the oxidant than the anti-reflective layer is oxidized by the HF solution, thereby increasing the stability of the exposed surface of the semiconductor substrate with hydrophilic properties. Such porous anti-reflective layers may typically be less dense than hydrophilic surfaces Making the surface of the integrated circuit substrate hydrophillic can, therefore, suppress the occurrence of semi-spherical defects on the exposed surface of the integrated circuit substrate 100.

Preferably, the ratio of the HF solution to the $H_2O_2$ solution is in a range between about 14:800 to 14:1400 by volume in the solution. If, for example, the solution contains HF solution, $H_2O_2$ solution and deionized water, the amount of the $H_2O_2$ solution is about 50% or more by volume of the solution. Furthermore, it is preferable that the amount of the $H_2O_2$ solution is preferably in the range of 50 to 80% by volume of the solution to reduce the growth of an oxide layer on the surface of the gate electrode 124. Preferably, the amount of the deionized water is in the range of 0 to 50% by volume of the solution.

Ozone water can be used as another oxidant along with the HF solution in the solution. Ozone water may show good solubility in an acidic solution at a low dissolution rate. It will be understood that ozone water may show acceptable solubility under other conditions as well. A mixture of HF and ozone water can be prepared based on this property. In other words, HF gas can be dissolved in water vapor and ozone gas may then be dissolved and saturated in an acidic solution to obtain the solution of HF and ozone water.

According to the present invention, when the anti-reflective pattern 126 is removed using the solution 130 containing the fluorine containing compound and the oxidant, as shown in FIG. 4C, a remnant anti-reflective layer including the semi-spherical defects that remains on the surface of the gate electrode 124 can be more fully removed. In addition, removal of other material layers peripheral to the anti-reflective layer, such as the isolation region 102 and the gate oxide layer 122 can be reduced and growth of an oxide layer on the surface of the gate electrode 124 can be reduced.

In the fabrication of integrated circuits according to the present invention, an anti-reflective layer used in a photolithographic process can be removed using a solution including a fluorine containing compound and an oxidant. Formation of a remnant anti-reflective layer including semi-spherical defects, which would otherwise possibly remain after removal of the anti-reflective layer, if the anti-reflective layer is formed on a hydrophobic layer such as a polysilicon layer, can be reduced. In addition, the removal of peripheral layers such as an oxide layer can be reduced. The growth of an oxide layer on the surface of the polysilicon layer can be also be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for fabricating an integrated circuit comprising:

etching an anti-reflective pattern in an integrated circuit using a solution comprising:
a fluorine containing compound;
an oxidant; and
water, wherein the solution comprises more than about 50% of the oxidant by volume.

2. A method according to claim 1, wherein a ratio of the fluorine containing compound to the oxidant in the solution is in a range between about 14:800 and 14:1000 by volume.

3. A method according to claim 1, wherein the solution comprises about 50% to 80% by volume of an $H_2O_2$ solution that is 30% pure.

4. A method for fabricating an integrated circuit comprising:
   etching an anti-reflective pattern in an integrated circuit using a solution comprising:
   a 49% pure HF solution;
   a 30% pure $H_2O_2$ solution; and
   water, wherein the 49% pure HF solution and the 30% pure $H_2O_2$ solution are mixed in a ratio of 14:800 to 14:1400 by volume in the solution.

5. A method according to claim 4, herein a ratio of the 49% pure HF solution to the 30% pure $H_2O_2$ solution to the water in the solution is in a range between about 14:1100:300 to 14:1000:400 by volume.

6. A method for fabricating an integrated circuit comprising:
   etching an anti-reflective pattern in an integrated circuit using a solution comprising:
   a fluorine containing compound;
   an oxidant comprising ozone water; and
   water, wherein the solution comprises more than about 50% of the oxidant by volume.

7. A method according to claim 1, wherein the oxidant comprises an $H_2O_2$ solution that is 30% pure.

8. A method for fabricating an integrated circuit compsing:
   etching an anti-reflective pattern in an integrated circuit using a solution comprising:
   a fluorine containing compound comprising HF;
   an oxidant; and
   water, wherein the solution comprises more than about 50% of the oxidant by volume.

9. A method according to claim 8, wherein the HF is 49% pure.

10. A method for fabricating an integrated circuit comprising:
    etching an anti-reflective pattern in an integrated circuit using a solution comprising:
    a fluorine containing compound;
    an oxidant; and
    water, wherein the anti-reflective pattern comprises a silicon oxynitride layer, and wherein the fluorine containing compound and the oxidant are mixed in a ratio of 14:800 to 14:1400 by volume in the solution.

11. A method for fabricating an integrated circuit comprising:
    removing an anti-reflective layer in the integrated circuit using a solution comprising:
    a fluorine containing compound;
    an oxidant; and
    water, wherein the fluorine containing compound and the oxidant are mixed in a ratio of 14:800 to 14:1400 by volume in the solution.

12. A method for fabricating an integrated circuit comprising:
    removing an anti-reflective layer in the integrated circuit using a solution comprising:
    a fluorine containing compound;
    an oxidant; and
    water, wherein the water comprises deionized water that is above 0% to about 50% by volume of the solution, and wherein the fluorine containing compound and the oxidant are mixed in a ratio of 14:800 to 14:1400 by volume in the solution.

13. A method for fabricating an integrated circuit comprising:
    removing an anti-reflective layer in the integrated circuit using a solution comprising:
    a fluorine containing compound;
    an oxidant; and
    water, wherein the act of removing the anti-reflective layer is followed by forming a gate electrode, and wherein the fluorine containing compound and the oxidant are mixed in a ratio of 14:800 to 14:1400 by volume in the solution.

14. A method for fabricating an integrated circuit comprising:
    forming a conductive layer on an integrated circuit substrate;
    forming an anti-reflective layer on the conductive layer;
    forming a photoresist pattern on the anti-reflective layer;
    etching the anti-reflective layer and the conductive layer using the photoresist pattern as an etching mask to provide an anti-reflective pattern and a gate electrode;
    removing the photoresist pattern; and
    removing the anti-reflective pattern using a solution comprising a fluorine containing compound, at least 50% by volume of an oxidant, and water.

15. A method according to claim 14, wherein the conductive layer comprises doped polysilicon.

16. A method according to claim 14, wherein the anti-reflective layer comprises a silicon oxynitride layer.

17. A method according to claim 14, wherein the fluorine containing compound comprises HF.

18. A method according to claim 14, wherein the oxidant comprises $H_2O_2$.

19. A method according to claim 14, wherein the act of forming the anti-reflective layer comprises forming the anti-reflective layer using one of a chemical vapor deposition and a physical vapor deposition.

20. A method according to claim 14, wherein the solution comprises HF and $H_2O_2$.

21. A method according to claim 1, wherein the fluorine containing compound comprises a 49% pure HF solution and the oxidant comprises a 30% pure $H_2O_2$ solution, and wherein the fluorine containing compound and the oxidant are mixed in a ratio of 14:800 to 14:1400 by volume in the solution.

22. A method according to claim 14, wherein the water comprises deionized water.

23. A method according to claim 22, wherein the solution comprises above 0% to 50% deionized water by volume.

24. A method according to claim 14, wherein the solution comprises 30% purity of $H_2O_2$ that is 50% or more of the solution by volume.

25. A method according to claim 18, wherein the amount of the $H_2O_2$ solution is in the range of 50 to 80% by volume of the solution.

26. A method according to claim 16, wherein the solution comprises HF and ozone water.

* * * * *

UNITED STATES PATENT AND TRADEMARK OFFICE
CERTIFICATE OF CORRECTION

PATENT NO. : 6,562,727 B2
DATED : May 13, 2003
INVENTOR(S) : Yeo et al.

It is certified that error appears in the above-identified patent and that said Letters Patent is hereby corrected as shown below:

<u>Column 8,</u>
Line 62, should read -- A method according to Claim 14, wherein the solution --

Signed and Sealed this

Fourteenth Day of October, 2003

JAMES E. ROGAN
*Director of the United States Patent and Trademark Office*